(12) United States Patent
Nair et al.

(10) Patent No.: US 6,538,502 B2
(45) Date of Patent: Mar. 25, 2003

(54) HIGH BANDWIDTH SWITCHED CAPACITOR INPUT RECEIVER

(75) Inventors: Rajendran Nair, Hillsboro, OR (US); Stephen R. Mooney, Beaverton, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 09/749,061

(22) Filed: Dec. 27, 2000

(65) Prior Publication Data

US 2002/0079959 A1 Jun. 27, 2002

(51) Int. Cl.$^7$ .............................. H03F 1/02; H03F 1/14; H03L 5/00; H03K 17/00
(52) U.S. Cl. ............................. 330/9; 330/51; 327/307; 327/124
(58) Field of Search ....................... 330/9, 51; 327/307, 327/124

(56) References Cited

U.S. PATENT DOCUMENTS

| | | | | |
|---|---|---|---|---|
| 5,359,652 A | * | 10/1994 | Mulder et al. | 327/307 |
| 5,391,999 A | * | 2/1995 | Early et al. | 327/337 |
| 5,606,320 A | * | 2/1997 | Kleks | 341/118 |
| 5,867,012 A | * | 2/1999 | Tuthill | 323/313 |
| 5,869,987 A | * | 2/1999 | Tang | 327/307 |
| 6,313,779 B1 | * | 11/2001 | Leung et al. | 341/155 |

* cited by examiner

Primary Examiner—Patricia Nguyen
(74) Attorney, Agent, or Firm—Blakely, Sokoloff, Taylor & Zafman LLP

(57) ABSTRACT

A differential amplifier has input and output terminals to generate a second signal at the output terminals for a first signal. The amplifier has feedback switches between the output terminals and the input terminals. Offset capacitors are coupled to the differential amplifier at the input terminals and reference voltages via charging switches to provide offsets for the first signal form the reference voltages via input switches.

30 Claims, 4 Drawing Sheets

HIGH BANDWIDTH SWITCHED CAPACITOR INPUT RECEIVER

BACKGROUND

1. Field of the Invention

This invention relates to signal transmission. In particular, the invention relates to input receivers.

2. Description of Related Art

Maintaining data integrity in signal transmission is significant in system design, especially at high bandwidths. As operating frequencies of digital processors increase to meet performance requirements, ultra large-scale integration (ULSI) necessitates the reduction in operating voltages to reduce the increased power consumption. Reducing operating voltages may lead to reducing noise margin and available voltage swings for input/output (I/O) circuits. The reduction in noise margin and voltage swings may affect data integrity in signal transmission for inter-chip data transfers.

One important component of the signaling system for inter-chip data transfers is the input receiver circuit. The input receiver circuit receives signals transmitted along the transmission wires. Since the transmitted signal levels may be attenuated as much as a factor of 10 due to losses along transmission wires, the input receiver circuit faces with a difficult task of receiving and amplifying very small voltage swings of a few tens of millivolts. This difficulty is even more significant when the circuit operates at high bandwidths.

BRIEF DESCRIPTION OF THE DRAWINGS

The features and advantages of the present invention will become apparent from the following detailed description of the present invention in which.

DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
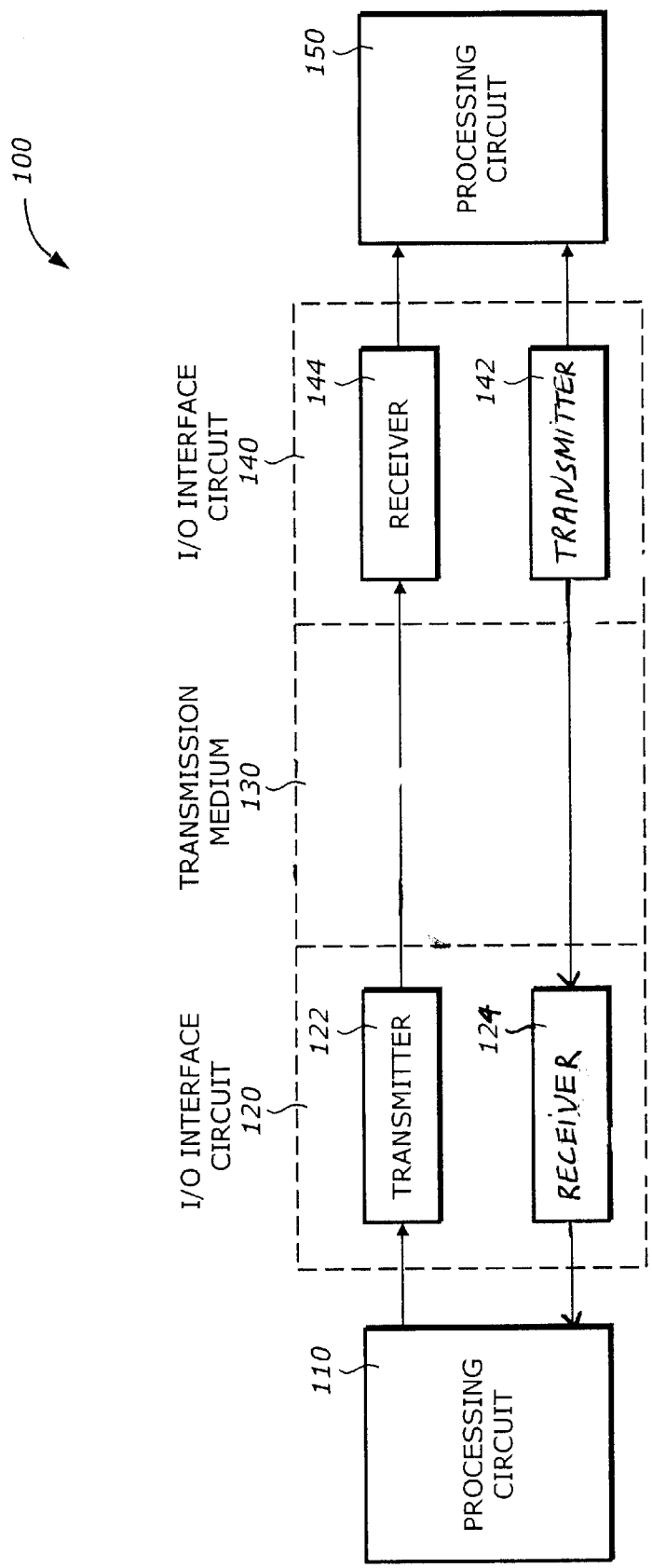
FIG. 1 is a diagram illustrating a system in which one embodiment of the invention can be practiced.

FIG. 1 is a diagram illustrating a system 100 in which one embodiment of the invention can be practiced. The system 100 includes processing circuits 110 and 150, input/output interface circuits 120 and 140, and transmission medium 130.

The processing circuits 110 and 150 are any circuits, digital or analog, that transmit and/or receive signals over the transmission medium 130. The processing circuits 110 and 150 may be part of a microprocessor, a memory controller, an I/O device, a graphics processor, a host bridge chipset, a media (e.g., audio, video) interface device, a communication interface device, or any device that can send and receive data. The processing circuits 110 and 150 may be the same device or separate devices. Typically, the processing circuits 110 and 150 are capable of operating at high frequencies up to and beyond 5 GHz.

The I/O interface circuits 120 and 140 are connected to the processing circuits 110 and 150, respectively, to provide interface for sending and receiving data. The I/O interface circuits 120 and 140 include transmitters 122 and 142 and receivers 124 and 144, respectively. Although both a transmitter and a receiver are shown for each I/O interface circuit, it is contemplated that the present invention can be practiced if there is only either a transmitter or a receiver. The transmitters 122 and 142 are interface circuits for sending data to the transmission medium 130. The transmitters 122 and 142 are capable of operating at frequencies compatible with the corresponding processing circuits 110 and 150. The receivers 124 and 144 are interface circuits for receiving data from the transmission medium 130. Like transmitters 122 and 142, the receivers 124 and 144 are capable of operating at frequencies compatible with the corresponding processing circuits 110 and 150.

The transmission medium 130 provides a medium for carrying the signals transmitted by the processing circuits 110 and 150. The transmission medium 130 is made of material compatible with the electrical and/or electromagnetic requirements for the signal or data generated by the I/O interface circuits 120 and 140. The transmission medium 130 may include electrical wires, conductors, signal traces on printed circuit boards. The transmission medium 130 may be configured for unidirectional (e.g., half duplex) or bi-directional (e.g., full-duplex) operation. The signals transmitted on the transmission medium 130 are typically signals at high bandwidths having low voltage swings due to losses.

Figure 2:
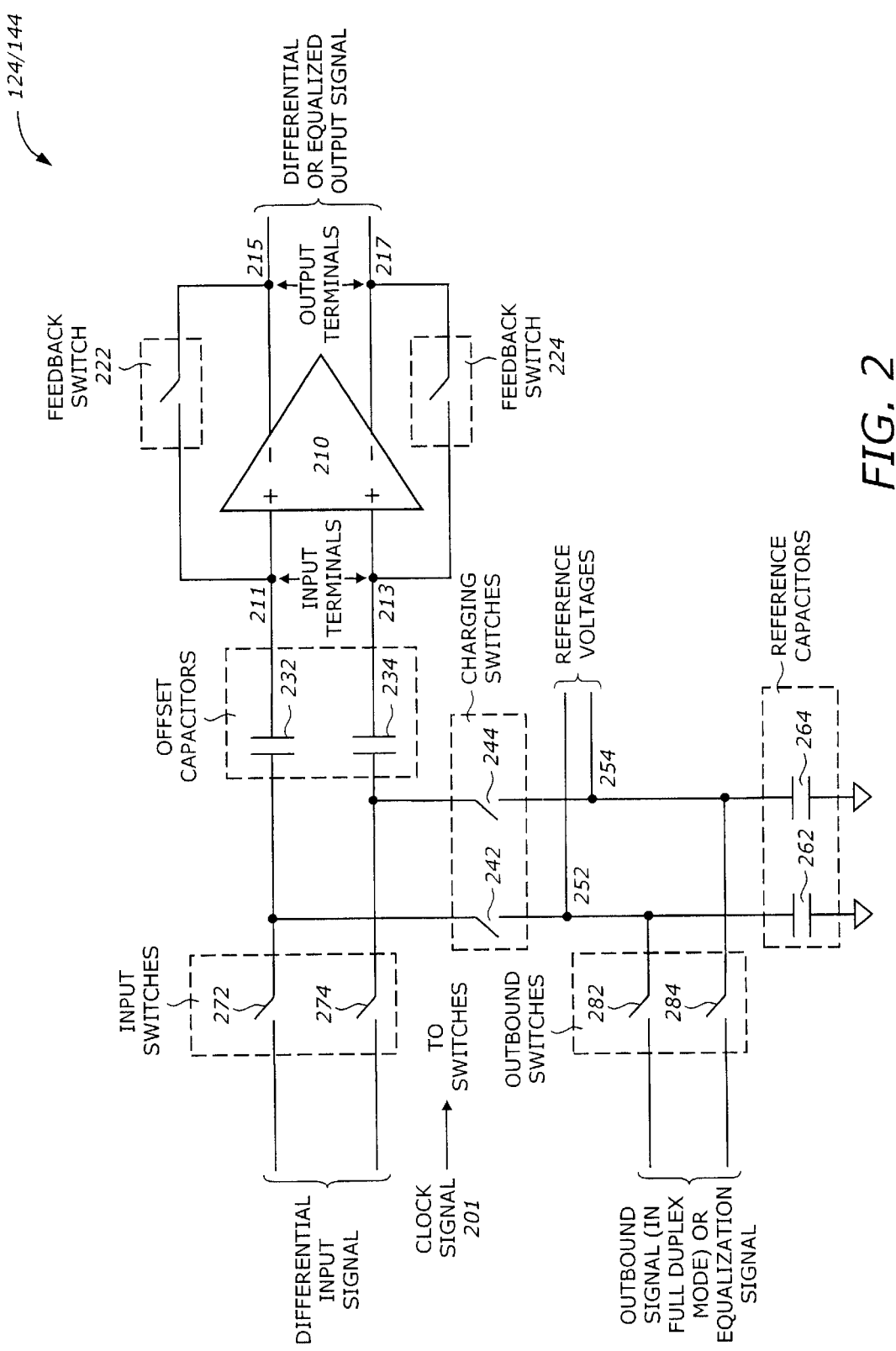
FIG. 2 is a diagram illustrating a receiver shown in FIG. 1 according to one embodiment of the invention.

FIG. 2 is a diagram illustrating the receiver 124/144 shown in FIG. 1 according to one embodiment of the invention. For ease of reference, only the reference symbol 124 is used. The receiver 124 includes an amplifier 210, feedback switches 222 and 224, offset capacitors 232 and 234, charging switches 242 and 244, reference voltages 252 and 254, and input switches 272 and 274. The receiver 124 receives a differential input signal transmitted from the transmission medium 130 and generates a differential output signal.

The amplifier 210 is a differential amplifier with input terminals 211 and 213 and output terminals 215 and 217. The amplifier 210 generates a differential output signal, or differential amplifier output, at the output terminals 215 and 217 from the differential amplifier input at the input terminals 211 and 213. The amplifier 210 essentially operates in two modes, or phases, depending on a clock signal 201 which controls the switching of the feedback switches 222 and 224, the charging switches 242 and 244, and the input switches 272 and 274.

The feedback switches 222 and 224, the charging switches 242 and 244, and the input switches 272 and 274 may be any appropriate switches that can connect and disconnect the path. An example of the switches include transmission gates (e.g., semiconductor switches).

The feedback switches 222 and 224 are placed between the input terminals 211 and 213 and the output terminals 215 and 217, respectively. When the feedback switches 222 and 224 are closed, the amplifier 210 is configured as in a negative feedback mode and operates as a unity gain amplifier. When the feedback switches 222 and 224 are open, the amplifier 210 operates in an open loop with predetermined gain of A.

The offset capacitors 232 and 234 store the amplifier input offset. The offset stored at the offset capacitors 232 and 234 is used to offset or subtract from the differential input signal. In one embodiment, the offset capacitors 232 and 234 are charged by the reference voltages 252 and 254. The charging switches 242 and 244 provide the charging path for the offset capacitors 232 and 234 from the reference voltages 252 and 254.

The reference voltages 252 and 254 provide charging voltage to charge the corresponding offset capacitors 232 and 234 to compensate, offset, or add to the differential input signal. For unidirectional transmission, the reference voltages 252 and 254 are predetermined voltages selected to be close to common mode voltage of the differential input signal or they could be voltages required for equalization of the received input signal. For full duplex operation, the reference voltages 252 and 254 are the voltages corresponding to the charge stored on the reference capacitors 272 and 274, and they form the outbound signal via outbound switches 282 and 284. Like the feedback switches 222 and 224, the charging switches 242 and 244, and the input switches 272 and 274, the outbound switches 282 and 284 may be transmission gates.

The receiver 124 operates based on two clock phases of the clock signal 201. In the unidirectional mode, the first phase is an offset store phase when the input switches 272 and 274 are open, and the feedback switches 222 and 224, the charging switches 242 and 244, and the outbound switches 282 and 284 are closed. The second phase is the evaluate phase when the input switches 272 and 274 are closed, and the feedback switches 222 and 224, charging switches 242 and 244, and the outbound switches 282 and 284 are open.

In the offset store phase of a full duplex mode, the charging switches 242 and 244 are open, and the feedback switches 222 and 224, the input switches 272 and 274, and the outbound switches 282 and 284 are closed. In the evaluate phase of the full duplex mode, the charging switches 242 and 244 are closed, and the feedback switches 222 and 224, input switches 272 and 274, and the outbound switches 282 and 284 are open.

The receiver 124 may be used to achieve receiver equalization. In this configuration, the equalization signal corresponds to the outbound signal in the full-duplex configuration. The equalization value computed in the offset store phase may be stored on the offset capacitors 232 and 234. In the evaluate phase, the equalization and received signals are summed into the differential amplifier input. The differential amplifier output then corresponds to the equalized and amplified input signal.

Figure 3:
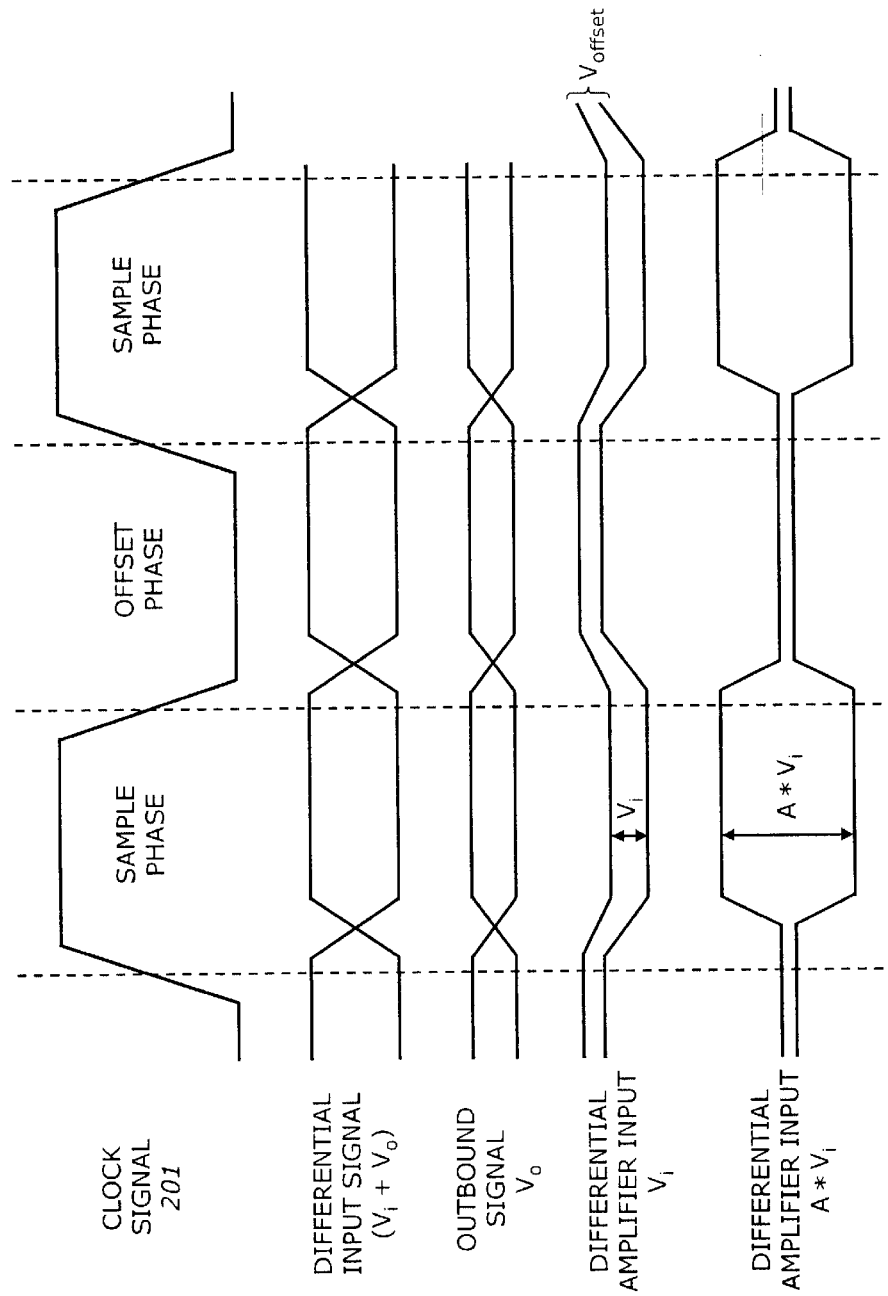
FIG. 3 is a timing diagram illustrating a full-duplex operation according to one embodiment of the invention.

FIG. 3 is a timing diagram illustrating a full-duplex operation according to one embodiment of the invention. The timing diagram illustrates the relationship among the differential input signal, the outbound signal, the differential amplifier input, and the differential amplifier output in two modes of operation.

The clock signal 201 shows two phases: an offset store phase and an evaluate phase. The HIGH and LOW level of the clock signal 201 is merely for illustrative purposes, and is not used to represent the phases.

The differential input signal represents the sum of the differential amplifier input Vi and the outbound signal Vo. In one embodiment, the outbound signal Vo provides the charge for the corresponding reference capacitors 262 and 264.

In one embodiment (i.e., full duplex mode), during the offset store phase, the switches 222, 224, 272, 274, 282, and 284 are closed, the charging switches 242 and 244 are open (FIG. 2). The amplifier 210 (FIG. 2) operates as a unity gain amplifier. The offset capacitors 232 and 234 (FIG. 2) are charged by the charges stored on the reference capacitors 262 and 264 (FIG. 2). Therefore, the differential amplifier input assumes the offset voltage Vos. This offset voltage Vos is essentially representative of the outbound signal Vo.

During the evaluate phase, the switches 222, 224, 272, 274, 282, and 284 are open, the switches 242, and 244 are closed (FIG. 2). The amplifier 210 (FIG. 2) operates as an open-loop amplifier with a gain of A. The differential input signal is offset by the voltages at the offset capacitors 232 and 234 in the offset store phase. Therefore, the differential amplifier input shows the voltage swing of Vi. Typically, this voltage swing is small. In one embodiment, this voltage swing may be tens of millivolts for a supply voltage between 1 to 3 volts. The differential amplifier output has a voltage swing of A*Vi, which is significantly larger than Vi.

Figure 4:
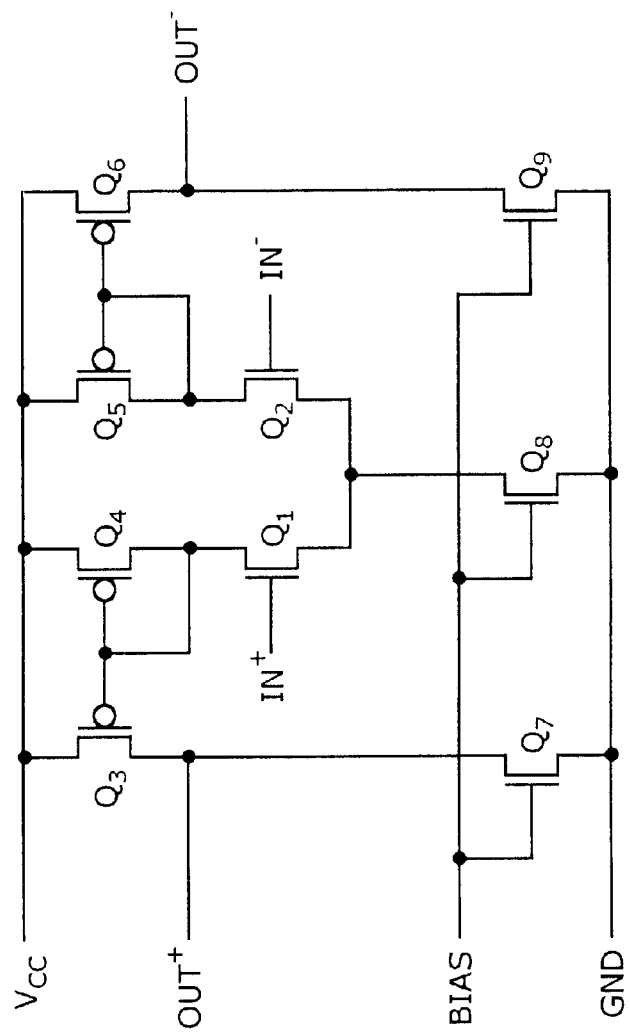
FIG. 4 is a diagram illustrating a differential amplifier according to one embodiment of the invention.

FIG. 4 is a diagram illustrating the differential amplifier 210 according to one embodiment of the invention. The amplifier 210 includes the transistors Q1, Q2, Q3, Q4, Q5, Q6, Q7, Q8, and Q9. In one embodiment, these transistors are implemented by Complementary Metal Oxide Semiconductor (CMOS) transistors.

The desirable characteristics of the amplifier 210 include very high bandwidth, stability in feedback configuration, and very low output impedance. In one embodiment where the supply voltage is between 1 and 2 volts and the received input signal amplitude is a few hundred millivolts, the open loop amplifier gain A is typically around 5.

The gates to the transistors Q1 and Q2 correspond to the positive and negative voltages of the differential amplifier input. The transistors Q3 and Q4 form a current mirror circuit and correspond to the positive differential amplifier output. The transistors Q5 and Q6 form a current mirror circuit and correspond to the negative differential amplifier output.

The gates of the transistors Q7, Q8, and Q9 are controlled by a bias signal to adjust the DC level of the differential amplifier input and output.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
    a differential amplifier having input and output terminals to generate a second signal at the output terminals from a first signal, the amplifier having feedback switches between the output terminals and the input terminals; and
    offset capacitors coupled to the differential amplifier at the input terminals and reference voltages via charging switches to provide offsets for the first signal from the reference voltages at reference capacitors via input switches.

2. The apparatus of claim 1 wherein the charging switches are closed and the input and feedback switches are open in a first clock phase to store the offsets on the offset capacitors using the reference voltages.

3. The apparatus of claim 2 wherein charging switches are open and the input and feedback switches are closed in a second clock phase to compensate the first signal by the offsets.

4. The apparatus of claim 1 wherein the reference voltages are stored on the reference capacitors.

5. The apparatus of claim 3 wherein the reference voltages form outbound signal via outbound switches in a full duplex transmission.

6. The apparatus of claim 1 wherein the feedback, charging, and input switches are transmission gates.

7. The apparatus of claim 5 wherein the outbound switches are transmission gates.

8. The apparatus of claim 5 wherein the outbound switches are closed in the first clock phase and open in the second clock phase.

9. The apparatus of claim 5 wherein the reference voltages are close to common mode voltage of the first signal.

10. The apparatus of claim 5 wherein the outbound signal is an equalization signal.

11. A method comprising:
generating a second signal at the output terminals from a first signal by a differential amplifier having input and output terminals, the amplifier having feedback switches between the output terminals and the input terminals; and
providing offsets for the first signal via input switches by offset capacitors from reference voltages at reference capacitors, the offset capacitors being coupled to the differential amplifier at the input terminals and the reference voltages via charging switches.

12. The method of claim 11 wherein the charging switches are closed and the input and feedback switches are open in a first clock phase to store the offsets on the offset capacitors using the reference voltages.

13. The method of claim 12 wherein the charging switches are open and the input and feedback switches are closed in a second clock phase to compensate the first signal by the offsets.

14. The method of claim 11 wherein providing offsets comprises storing the reference voltages on the reference capacitors.

15. The method of claim 13 wherein the reference voltages form outbound signal via outbound switches in a full duplex transmission.

16. The method of claim 11 wherein the feedback, charging, and input switches are transmission gates.

17. The method of claim 15 wherein the outbound switches are transmission gates.

18. The method of claim 15 wherein the outbound switches are closed in the first clock phase and open in the second clock phase.

19. The method of claim 15 wherein the reference voltages are close to common mode voltage of the first signal.

20. The method of claim 15 wherein the outbound signal is an equalization signal.

21. A system comprising:
a signal transmitter to transmit a first signal;
a transmission medium coupled to the signal transmitter to carry the first signal; and
a receiver to receive the first signal, the receiver comprising:
a differential amplifier having input and output terminals to generate a second signal at the output terminals from the first signal, the amplifier having feedback switches between the output terminals and the input terminals, and
offset capacitors coupled to the differential amplifier at the input terminals and reference voltages via charging switches to provide offsets for the first signal from the reference voltages at reference capacitors via input switches.

22. The system of claim 21 wherein the charging switches are closed and the input and feedback switches are open in a first clock phase to store the offsets on the offset capacitors using the reference voltages.

23. The system of claim 22 wherein the charging switches are open and the input and feedback switches are closed in a second clock phase to compensate the first signal by the offsets.

24. The system of claim 21 wherein the reference voltages are stored on the reference capacitors.

25. The system of claim 23 wherein the reference voltages form outbound signal via outbound switches in a full duplex transmission.

26. The system of claim 21 wherein the feedback, charging, and input switches are transmission gates.

27. The system of claim 25 wherein the outbound switches are transmission gates.

28. The system of claim 25 wherein the outbound switches are closed in the first clock phase and open in the second clock phase.

29. The system of claim 25 wherein the reference voltages are close to common mode voltage of the first signal.

30. The system of claim 25 wherein the outbound signal is an equalization signal.

* * * * *